United States Patent
Kim et al.

(10) Patent No.: US 10,243,087 B2
(45) Date of Patent: Mar. 26, 2019

(54) BIFACIAL SOLAR CELL MODULE WITH BACKSIDE REFLECTOR

(71) Applicant: SunPower Corporation, San Jose, CA (US)

(72) Inventors: Sung Dug Kim, Pleasanton, CA (US); Gabriela Bunea, Santa Clara, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 15/783,234

(22) Filed: Oct. 13, 2017

(65) Prior Publication Data
US 2018/0053860 A1    Feb. 22, 2018

Related U.S. Application Data

(63) Continuation of application No. 13/660,292, filed on Oct. 25, 2012, now Pat. No. 9,812,590.

(51) Int. Cl.
| | |
|---|---|
| *H01L 31/02* | (2006.01) |
| *H01L 31/054* | (2014.01) |
| *H02S 40/22* | (2014.01) |
| *H01L 31/049* | (2014.01) |
| *H01L 31/056* | (2014.01) |

(52) U.S. Cl.
CPC ............ *H01L 31/02* (2013.01); *H01L 31/049* (2014.12); *H01L 31/056* (2014.12); *H01L 31/0547* (2014.12); *H02S 40/22* (2014.12); *Y02E 10/52* (2013.01)

(58) Field of Classification Search
CPC ..................................................... H01L 31/056
See application file for complete search history.

(56) References Cited

U.S. PATENT DOCUMENTS

2006/0272698 A1* 12/2006 Durvasula ........... H01L 31/0547
                                                                 136/246

* cited by examiner

*Primary Examiner* — Eli S Mekhlin
(74) *Attorney, Agent, or Firm* — Okamoto & Benedicto LLP

(57) ABSTRACT

A bifacial solar cell module includes solar cells that are protected by front side packaging components and backside packaging components. The front side packaging components include a transparent top cover on a front portion of the solar cell module. The backside packaging components have a transparent portion that allows light coming from a back portion of the solar cell module to reach the solar cells, and a reflective portion that reflects light coming from the front portion of the solar cell module. The transparent and reflective portions may be integrated with a backsheet, e.g., by printing colored pigments on the backsheet. The reflective portion may also be on a reflective component that is separate from the backsheet. In that case, the reflective component may be placed over a clear backsheet before or after packaging.

18 Claims, 9 Drawing Sheets

BIFACIAL SOLAR CELL MODULE WITH BACKSIDE REFLECTOR

CROSS-REFERENCE TO RELATED APPLICATION

This application is a continuation of U.S. patent application Ser. No. 13/660,292, filed on Oct. 25, 2012, now U.S. Pat. No. 9,812,590, issued on Nov. 7, 2017 which is incorporated herein by reference in its entirety.

TECHNICAL FIELD

Embodiments of the subject matter described herein relate generally to solar cells. More particularly, embodiments of the subject matter relate to solar cell modules.

BACKGROUND

Solar cells are well known devices for converting solar radiation to electrical energy. A solar cell has a front side that faces the sun during normal operation to collect solar radiation and a backside opposite the front side. Solar radiation impinging on the solar cell creates electrons and holes that migrate to diffusion regions, thereby creating voltage differentials between the diffusion regions. Metal contacts are formed to corresponding diffusion regions to allow an external electrical circuit, e.g., a load, to be connected to and be powered by the solar cell.

Solar cells may be serially connected and packaged together to form a solar cell module. The packaging provides environmental protection for the solar cells, and may include a top cover on the front side, an encapsulant that encapsulates the solar cells, and a backsheet that provides insulation on the backside. Embodiments of the present invention pertain to a backsheet and other backside packaging components that allow for increased solar radiation collection.

BRIEF SUMMARY

In one embodiment, a bifacial solar cell module includes solar cells that are protected by front side packaging components and backside packaging components. The front side packaging components include a transparent top cover on a front portion of the solar cell module. The backside packaging components have a transparent portion that allows light coming from a back portion of the solar cell module to reach the solar cells, and a reflective portion that reflects light coming from the front portion of the solar cell module. The transparent and reflective portions may be integrated with a backsheet, e.g., by printing colored pigments on the backsheet. The reflective portion may also be on a reflective component that is separate from the backsheet. In that case, the reflective component may be placed over a clear backsheet before or after packaging.

These and other features of the present invention will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The drawings are not to scale.

DETAILED DESCRIPTION

In the present disclosure, numerous specific details are provided, such as examples of components, materials, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
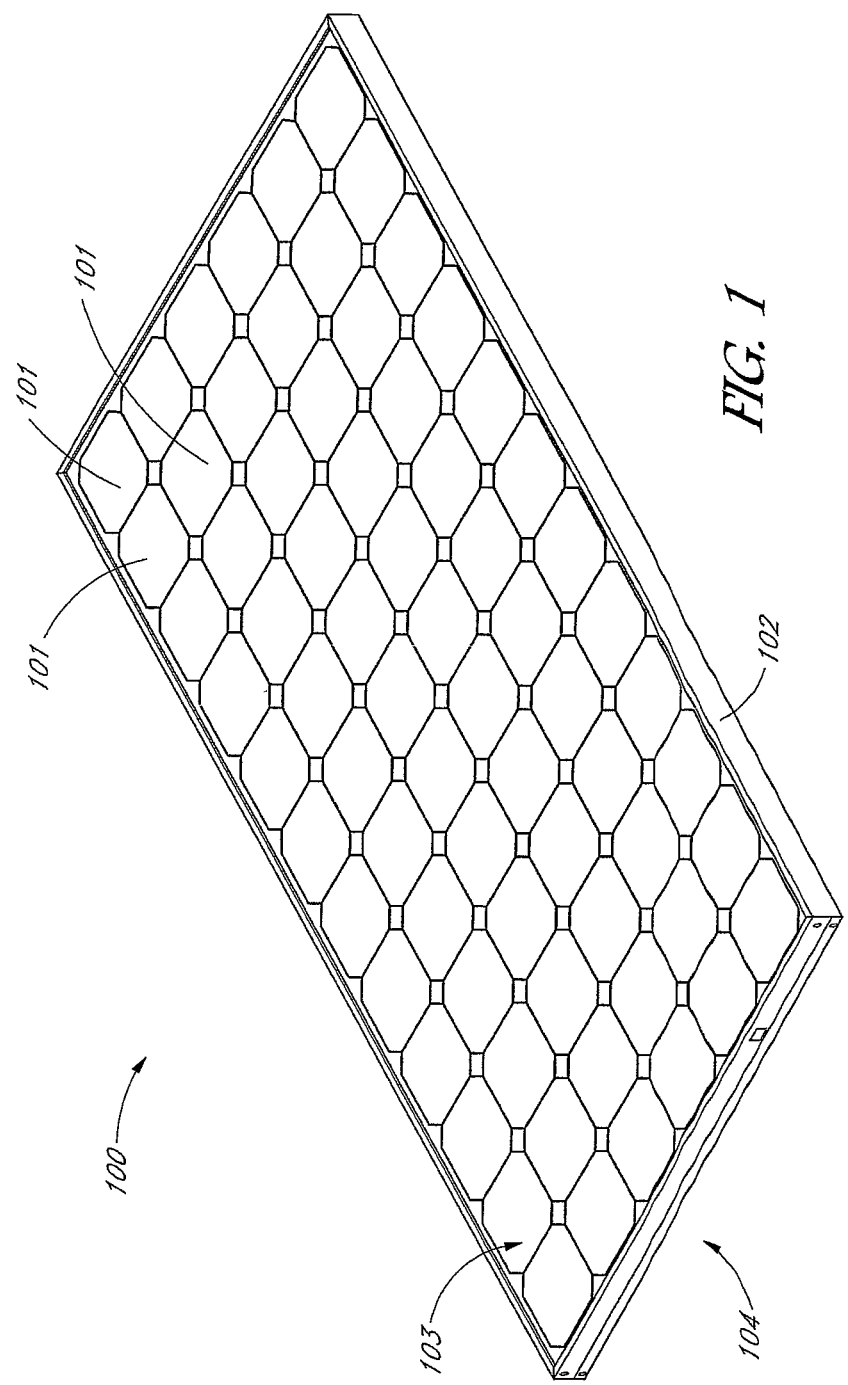
FIG. 1 shows a bifacial solar cell module in accordance with an embodiment of the present invention.

FIG. 1 shows a bifacial solar cell module 100 in accordance with an embodiment of the present invention. The bifacial solar cell module 100 is a so-called "terrestrial solar cell module" in that it is designed for use in stationary applications, such as on rooftops or by photovoltaic power plants. In the example of FIG. 1, the bifacial solar cell module 100 includes an array of interconnected solar cells 101. Only some of the solar cells 101 are labeled in FIG. 1 for clarity of illustration. In the example of FIG. 1, the solar cells 101 comprise backside contact solar cells. In a backside contact solar cell, all diffusion regions and metal contacts coupled to the diffusion regions are formed on the backside of the solar cell. That is, both the P-type and N-type diffusion regions and metal contacts coupled to them are on the backside of the solar cell. Embodiments of the present invention are especially advantageous when employed with backside contact solar cells, as they allow for collection of solar radiation from the backside that would otherwise be wasted. In other embodiments, the solar cells 101 may also be front side contact solar cells or other types of solar cells.

Visible in FIG. 1 are the front sides of the solar cells 101. The front sides of the solar cells 101 are also referred to as the "sun side" because they face towards the sun during normal operation. The backsides of the solar cells 101 are opposite the front sides. A frame 102 provides mechanical support for the solar cells 101. The front portion 103 of the bifacial solar cell module 100 is on the same side as the front sides of the solar cells 101 and is visible in FIG. 1. The back portion 104 of the bifacial solar cell module 100 is under the front portion 103. The back portion 104 of the bifacial solar cell module 100 is on the same side as the backsides of the solar cells 101. The bifacial solar cell module 100 is "bifacial" in that it allows for collection of solar radiation coming from the front portion 103 and the back portion 104.

Figure 2:
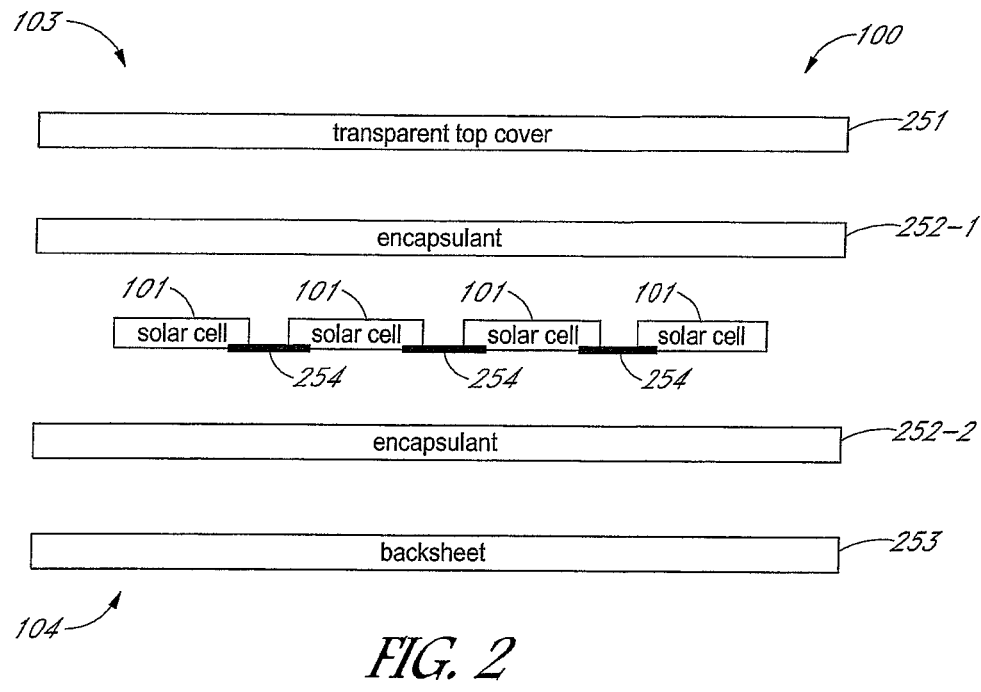
FIGS. 2-4 are cross-sectional views schematically illustrating a method for making a bifacial solar cell module in accordance with an embodiment of the present invention.
Figure 3:
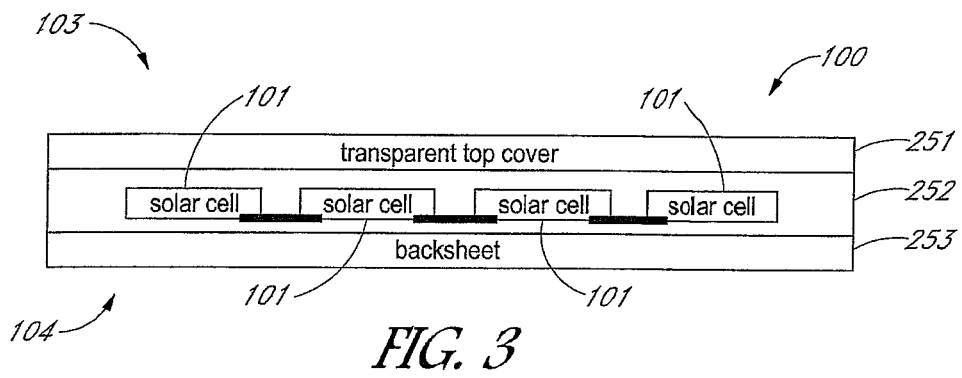
Figure 4:
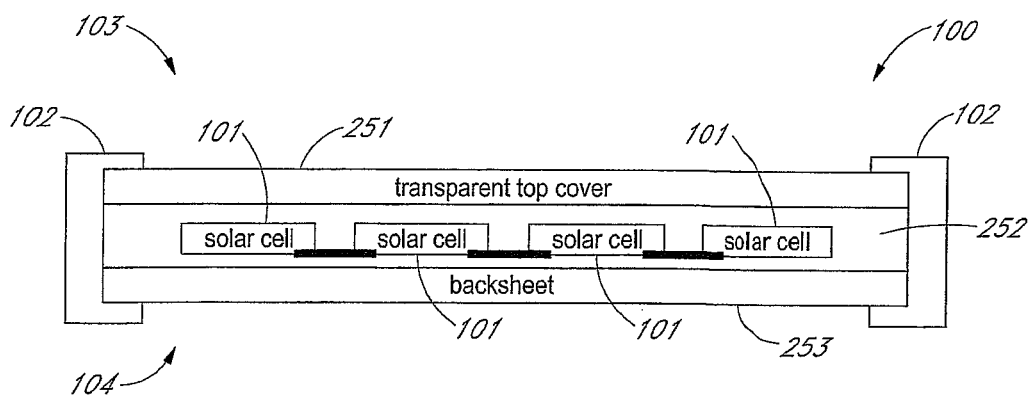

FIGS. 2-4 are cross-sectional views schematically illustrating a method of making a bifacial solar cell module 100 in accordance with an embodiment of the present invention.

FIG. 2 is an exploded view showing the components of the bifacial solar cell module 100 in accordance with an embodiment of the present invention. The bifacial solar cell module 100 may comprise a transparent top cover 251, sheets of encapsulant 252, the solar cells 101, interconnects 254, and a backsheet 253. The backsheet 253 may be any single layer or multiple layers of materials that provide environmental protection to other components of the solar cell module 100. For example, flouropolymer, polyvinylidene fluoride, polytetrafluoroethylene, polypropylene, polyphenylene sulfide, polyester, polycarbonate, or polyphenylene oxide may be used as a single layer or as part of multiple layers of backsheet. The encapsulant 252 on the front portion 103 is labeled as "252-1" and the encapsulant 252 on the back portion 104 is labeled as "252-2." The transparent top cover 251 and the front side encapsulant 252-1 serve as front side packaging components, and the encapsulant 252-2 and the backsheet 253 serve as backside packaging components. In the example of FIG. 2, the transparent top cover 251 is the outermost front side packaging component and the backsheet 253 is the outermost backside packaging component.

The transparent top cover 251 and the encapsulant 252 comprise optically transparent materials. The transparent top cover 251, which is the topmost layer on the front portion 103, protects the solar cells 101 from the environment. The bifacial solar cell module 100 is installed in the field such that the transparent top cover 251 faces the sun during normal operation. The front sides of the solar cells 101 face towards the sun by way of the transparent top cover 101. In the example of FIG. 2, the transparent top cover 201 comprises glass (e.g., 3.2 mm thick, soda lime glass).

The encapsulant 252 is configured to protectively encapsulate the solar cells 101. In one embodiment, the encapsulant 252 comprises a high resistivity material configured to prevent solar cell polarization by preventing electrical charge from leaking from the front sides of the solar cells 101 to other portions of the bifacial solar cell module 100. In one embodiment, the encapsulant 252 presents a high resistance path to electrical charges to prevent charge leakage from the front sides of the solar cells 101 to the frame 102 or other portions of the bifacial solar cell module 100 by way of the transparent top cover 251. In the example of FIG. 2, sheets of high resistivity encapsulant 252 are placed on the front sides and backsides of the solar cells 101. In some embodiments, a sheet of high resistivity encapsulant 252 is only on the front sides of the solar cells 101. In those embodiments, the sheet of encapsulant on the backsides of the solar cells 101 is not a high resistivity encapsulant, such as poly-ethyl-vinyl acetate ("EVA"), for example.

The interconnects 254 may comprise a metal for electrically interconnecting the solar cells 101. In the example of FIG. 2, the solar cells 101 comprise serially-connected backside contact solar cells, and the interconnects 254 electrically connect to corresponding P-type and N-type diffusion regions on the backsides of the solar cells 101. In one embodiment, interconnect shields (e.g., see FIG. 7, shield 256) are placed on the interconnects 254 on the sun side to visually block the interconnects 254 when viewed from the front portion 103 and/or to provide a reflective surface to scatter, i.e., reflect at multiple angles, light coming from the front portion 103. Interconnect shields for solar cell applications are also disclosed in commonly-assigned U.S. Pat. No. 7,390,961, which is incorporated herein by reference in its entirety.

The backsides of the solar cells 101 face the backsheet 253. In one embodiment, the backsheet 253 comprises Tedlar/Polyester/EVA ("TPE"). The backsheet 253 may also comprise Tedlar/Polyester/Tedlar ("TPT") or a multi-layer backsheet comprising a fluoropolymer, to name some examples. The backsheet 253 is on the back portion 104. As will be more apparent below, the backsheet 253 may comprise a backsheet printed with a reflective surface to reflect light that would otherwise escape towards the back portion 104.

In one embodiment, the transparent top cover 251, the encapsulant 252-1 on the front side, the solar cells 101 electrically connected by the interconnects 254, the encapsulant 252-2 on the backside, and the backsheet 253 are formed together to create a protective package. This is illustrated in FIG. 3, where the aforementioned components are formed together in a stacking order as shown in FIG. 2. More particularly, the solar cells 101 are placed between the encapsulants 252-1 and 252-2, the backsheet 253 is placed under the encapsulant 252-2, and the transparent top cover 251 is placed over the encapsulant 252-1. The just mentioned components are then pressed and heated together by vacuum lamination, for example. The lamination process melts together the sheet of encapsulant 252-1 and the sheet of encapsulant 252-2 to encapsulate the solar cells 101. In FIG. 3, the encapsulant 252-1 and the encapsulant 252-2 are simply labeled as "252" to indicate that that they have been melted together.

FIG. 4 shows the protective package of FIG. 3 mounted on the frame 102. Being encapsulated in the encapsulant 252, the solar cells 101 are electrically isolated from the frame 102.

Figure 5:
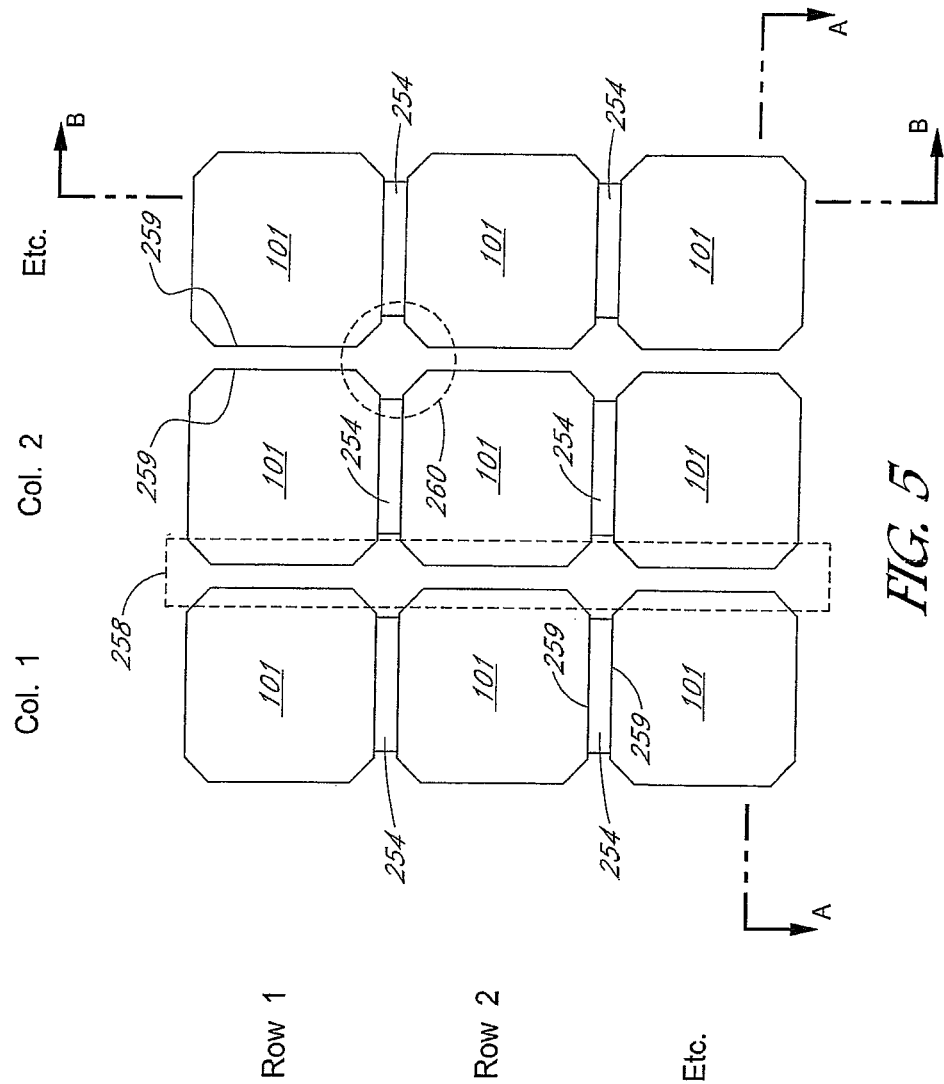
FIG. 5 schematically shows an arrangement of solar cells in a bifacial solar cell module in accordance with an embodiment of the present invention.

FIG. 5 schematically shows an arrangement of the solar cells 101 in the bifacial solar cell module 100 in accordance with an embodiment of the present invention. Only some of the solar cells 101 are shown for clarity of illustration. In the example of FIG. 5, the solar cells 101 are arranged in rectangular fashion in rows and columns. The solar cells 101 may be electrically connected in series by the interconnects 254 along a column. A column of solar cells 101 may be serially connected to an adjacent column of solar cells 101 at the ends of the columns (not shown). Of course, the solar cells 101 may also be interconnected by row.

Each solar cell 101 may be spaced apart from an adjacent solar cell 101 by about 2 mm on each side. As will be more apparent below, the space between solar cells 101 where there is no interconnect 254 may be covered by a reflective surface that is on the backsheet 253 (or other backside packaging component). For example, the space generally bounded by dotted lines 258 may have a corresponding reflective portion on the backsheet 253. The reflective portion may cover the area between sides of adjacent solar cells 101 (e.g., see sides 259) and the "diamond" area formed by four adjacent solar cells 101 (e.g., see diamond area 260).

Figure 6:
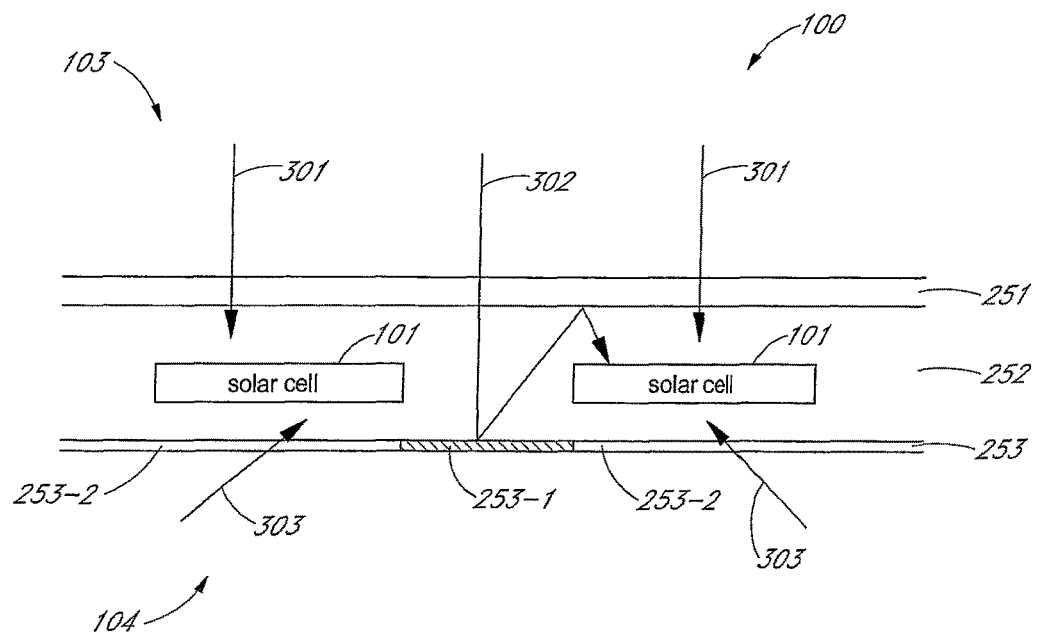
FIG. 6 schematically shows a cross section of a bifacial solar cell module in accordance with an embodiment of the present invention.

FIG. 6 schematically shows a cross section of the bifacial solar cell module 100 in accordance with an embodiment of the present invention. FIG. 6 is taken from along a row of solar cells 101, where the sides are not connected by interconnects 254 (e.g., see section A-A of FIG. 5). In the example of FIG. 6, the solar cells 101 along a column are connected by interconnects 254 going into the page of the figure.

In one embodiment, the backsheet 253 has a reflective portion 253-1 and transparent portions 253-2. The reflective portion 253-1 provides a reflective surface for scattering light and the transparent portions 253-2 are clear to allow light to readily pass through. In operation, light coming from the front portion 103 may pass through the transparent top cover 251, the encapsulant 252, and onto the front sides of the solar cells 101 (see arrows 301). Light coming from the front portion 103 but passes between the solar cells 101 is reflected by the reflective portion 253-1 (see arrow 302) towards the front portion 103. Some of the reflected light, which would otherwise be wasted, eventually enters the front sides of the solar cells 101 (see arrow 302). Light coming from the back portion 104 enters through the transparent portions 253-2 (see arrows 303) and may eventually enter the backsides or front sides of the solar cells 101. The reflective/transparent design of the backsheet 253, or other backside packaging component employing such design, thus allows for increased solar radiation collection.

In one embodiment, the reflective portion 253-1 has an average reflectance of at least 30%, preferably 50%, more preferably 70% in all wavelengths between 400 nm and 1200 nm. For example, the reflective portion 253-1 may comprise white pigments (e.g., titanium dioxide, barium sulfate, and mixtures thereof). The reflective portion 253-1 may also comprise other materials, such as ultra violet (UV) stabilizers and/or heat stabilizers. Other suitable colors for the reflective portion 253-1 may include black, red, green, or other color for cosmetic purpose. In general, the material and color of the reflective portion 253-1 may be selected for optimum light scattering for a particular solar cell module. For example, even though silver may be an excellent reflector, a reflective portion 253-1 made of silver may not scatter enough light to be efficient because most of the reflected light may simply reflect straight out of the solar cell module. In that case, when using silver or other highly reflective material, the reflective portion 253-1 may be textured for optimum light scattering.

Reflective materials may be printed directly on a clear, i.e., completely transparent, backsheet 253. The printed portion forms the reflective portion 253-1 and portions where the reflective material is not printed form the transparent portions 253-2.

Figure 7:
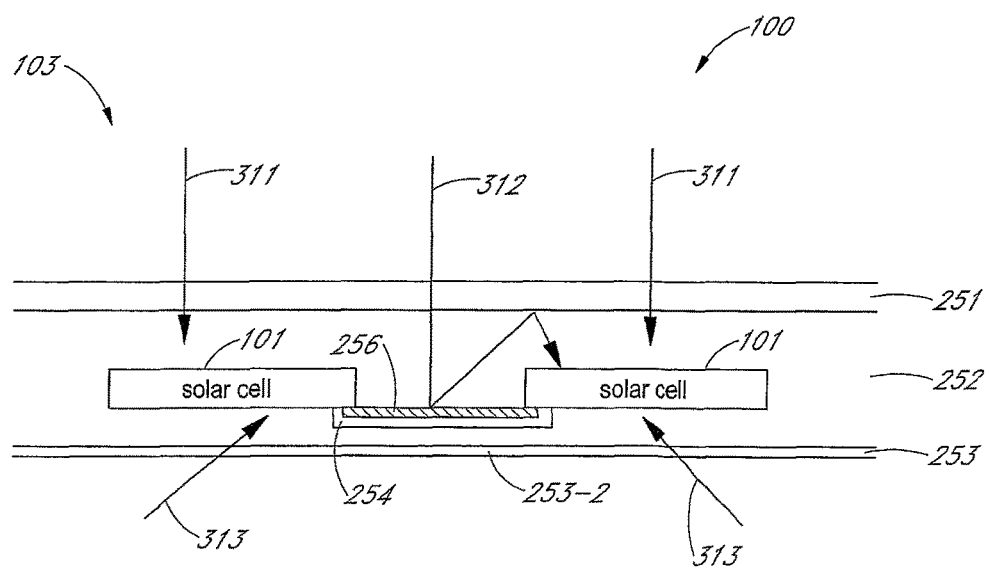
FIG. 7 schematically shows another cross section of a bifacial solar cell module in accordance with an embodiment of the present invention.

FIG. 7 schematically shows another cross section of the bifacial solar cell module 100 in accordance with an embodiment of the present invention. FIG. 7 is taken from along a column of solar cells 101 where there are interconnects 254 (e.g., see section B-B of FIG. 5). In the example of FIG. 7, a reflective interconnect shield 256 is placed towards the sun side to reflect light that would otherwise hit the front side of a corresponding interconnect 254. The reflective interconnect shield 256 may have the same properties and characteristics as the reflective portion 253-1 of the backsheet 253. In operation, light coming from the front portion 103 passes through the transparent top cover 251, the encapsulant 252, and onto the front sides of the solar cells 101 (see arrows 311). Light coming from the front portion 103 but passes between solar cells 101 is reflected by the interconnect shield 304 (see arrow 312) towards the front portion 103. Some of the reflected light, which would otherwise be wasted, eventually enters the front sides of the solar cells 101 (see arrow 312). Light coming from the back portion 104 enters through the transparent portions 253-2 (see arrows 313) and may eventually enter the backsides or front sides of the solar cells 101.

Figure 8:
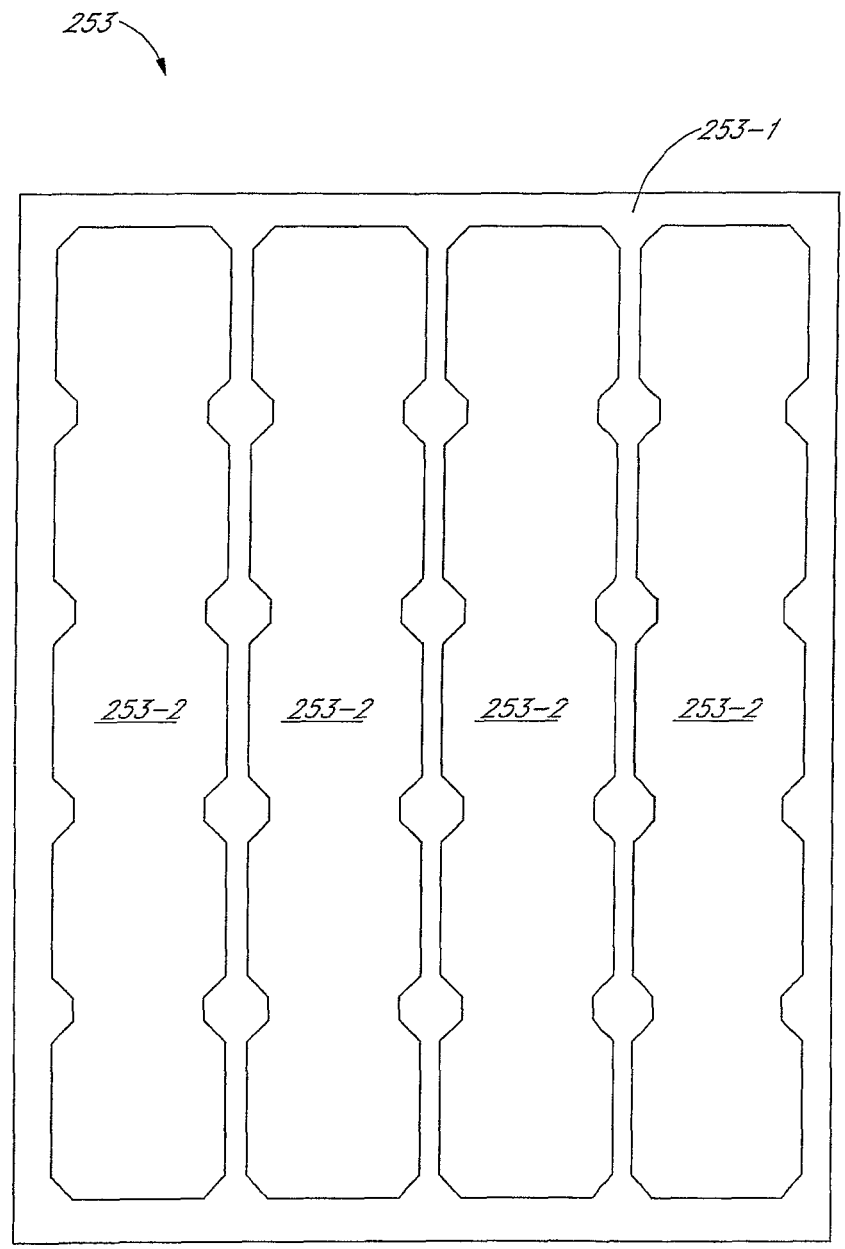
FIG. 8 shows a backsheet in accordance with an embodiment of the present invention.

FIG. 8 shows the backsheet 253 in accordance with an embodiment of the present invention. In the example of FIG. 8, the reflective portion 253-1 is configured to cover space between solar cells 101 along only one dimension (e.g., between columns of solar cells 101) where there is no interconnect 254 between the solar cells 101. For example, the reflective portion 253-1 may be configured to cover from 80% to 300% (e.g., for alignment tolerance in manufacturing) of the space between sides of the solar cells 101, and diamond areas formed by four adjacent solar cells 101. The transparent portions 253-2 allow light to freely pass through the backsheet 253 and onto the solar cells 101. The transparent portions 253-2 may have an average optical transmission of at least 50%, preferably 70%, more preferably 90% in all wavelengths between 400 nm and 1200 nm.

Figure 9:
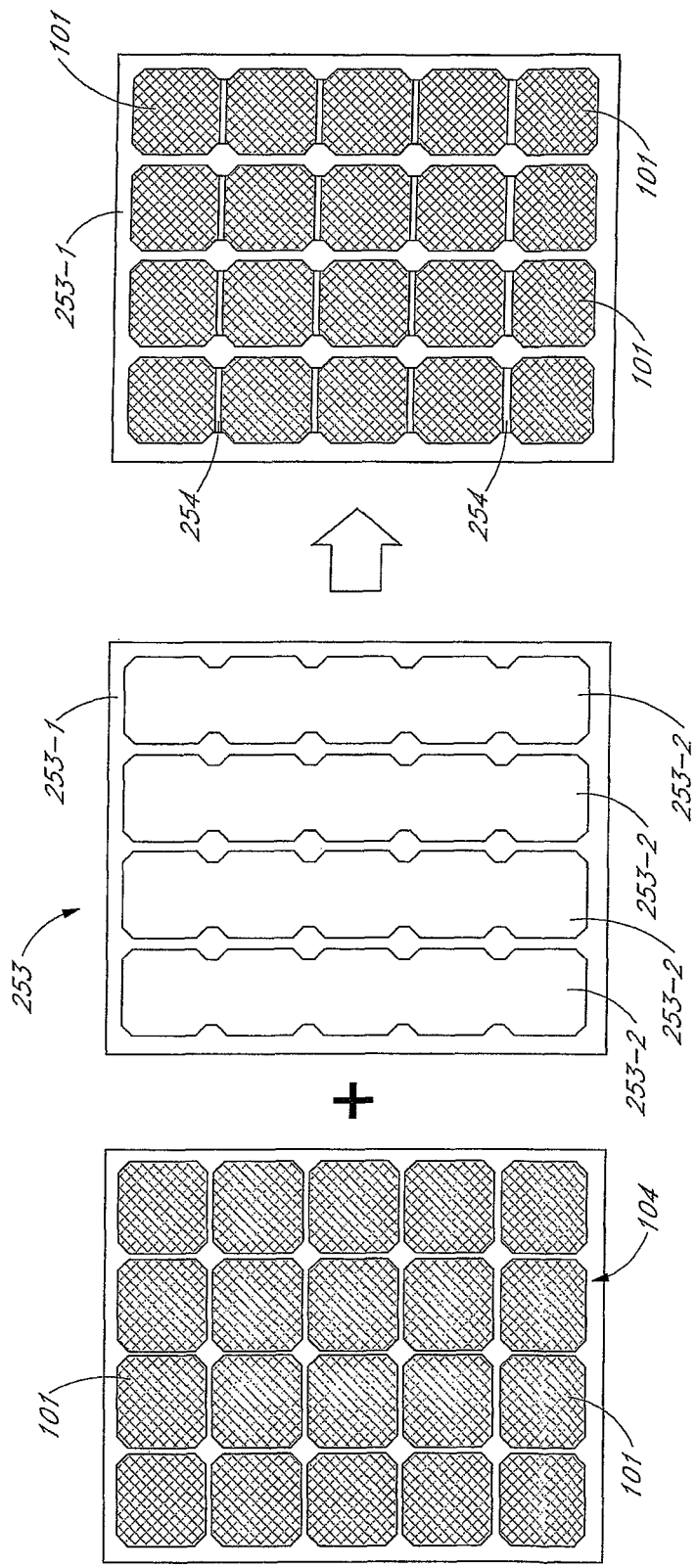
FIG. 9 schematically shows a backsheet that is overlaid on solar cells on a back portion of a bifacial solar cell module in accordance with an embodiment of the present invention.

FIG. 9 schematically illustrates the backsheet 253 overlaid on the solar cells 101 on the back portion 104 of the bifacial solar cell module 100 in accordance with an embodiment of the present invention. The example of FIG. 9 shows the bifacial solar cell module 100 as seen from the back portion 104. The backsheet 253 is placed over the solar cells 101 (only some are labeled in FIG. 9) and are formed together by, for example, vacuum lamination. Some of the interconnects 254 connecting the solar cells 101 are labeled in FIG. 9 for reference purposes. The backsides of the solar cells 101 show through the transparent portions 253-2, while the space between adjacent columns of solar cells 101 are covered by the reflective portion 253-1.

In other embodiments, the reflective portion 253-1 may also cover the space between two dimensions, such as between columns and rows of solar cells 101. An example of this embodiment is shown in the backsheet 253A of FIG. 10, where the reflective portion 253-1 covers the space between solar cells 101 in both the vertical and horizontal dimensions. The reflective portion 253-1 surrounds each solar cell 101 in this embodiment. As before, the transparent portions 253-2 expose the backsides of the solar cells 101, allowing light coming from the back portion 104 to pass through. The reflective portion 253-1 also covers the space between the frame and adjacent solar cells 101 along two dimensions.

Figure 10:
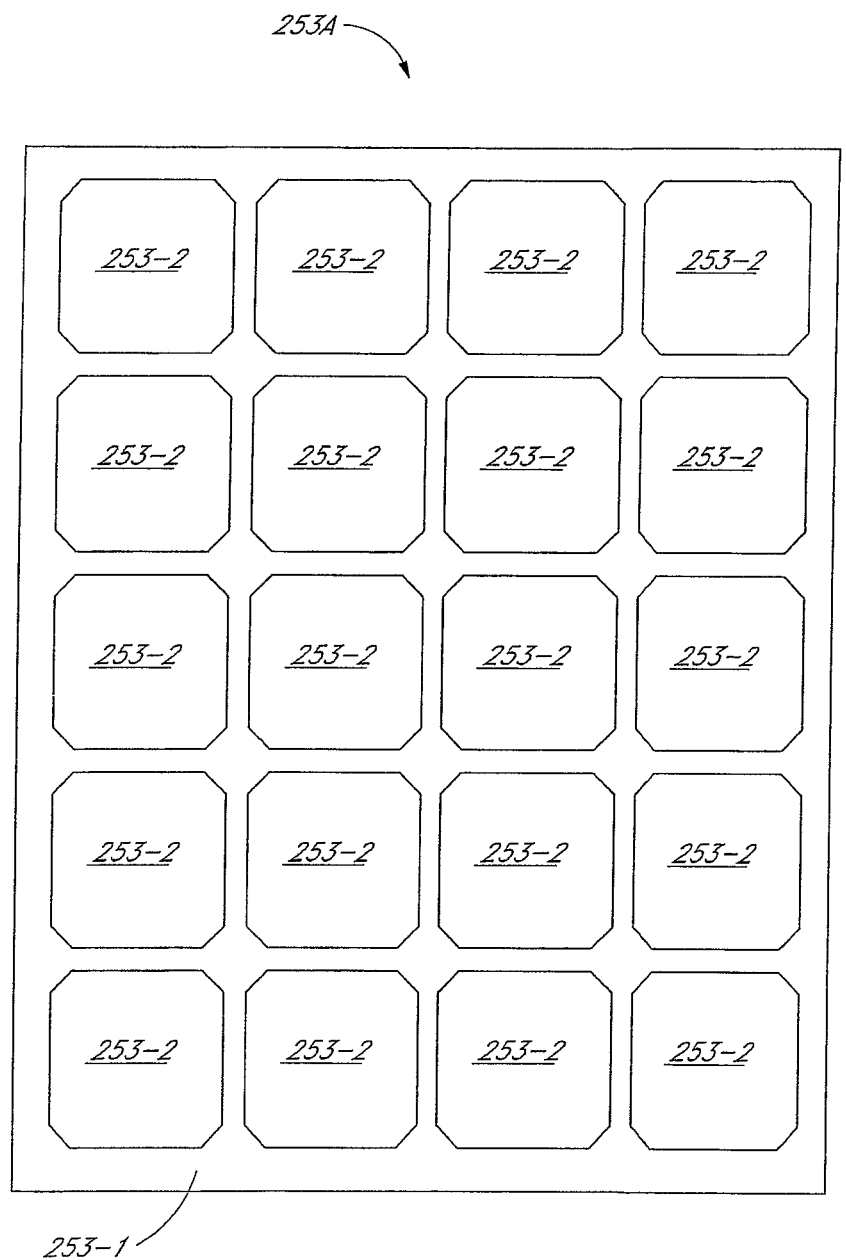
FIG. 10 schematically shows a backsheet in accordance with another embodiment of the present invention.
Figure 11:
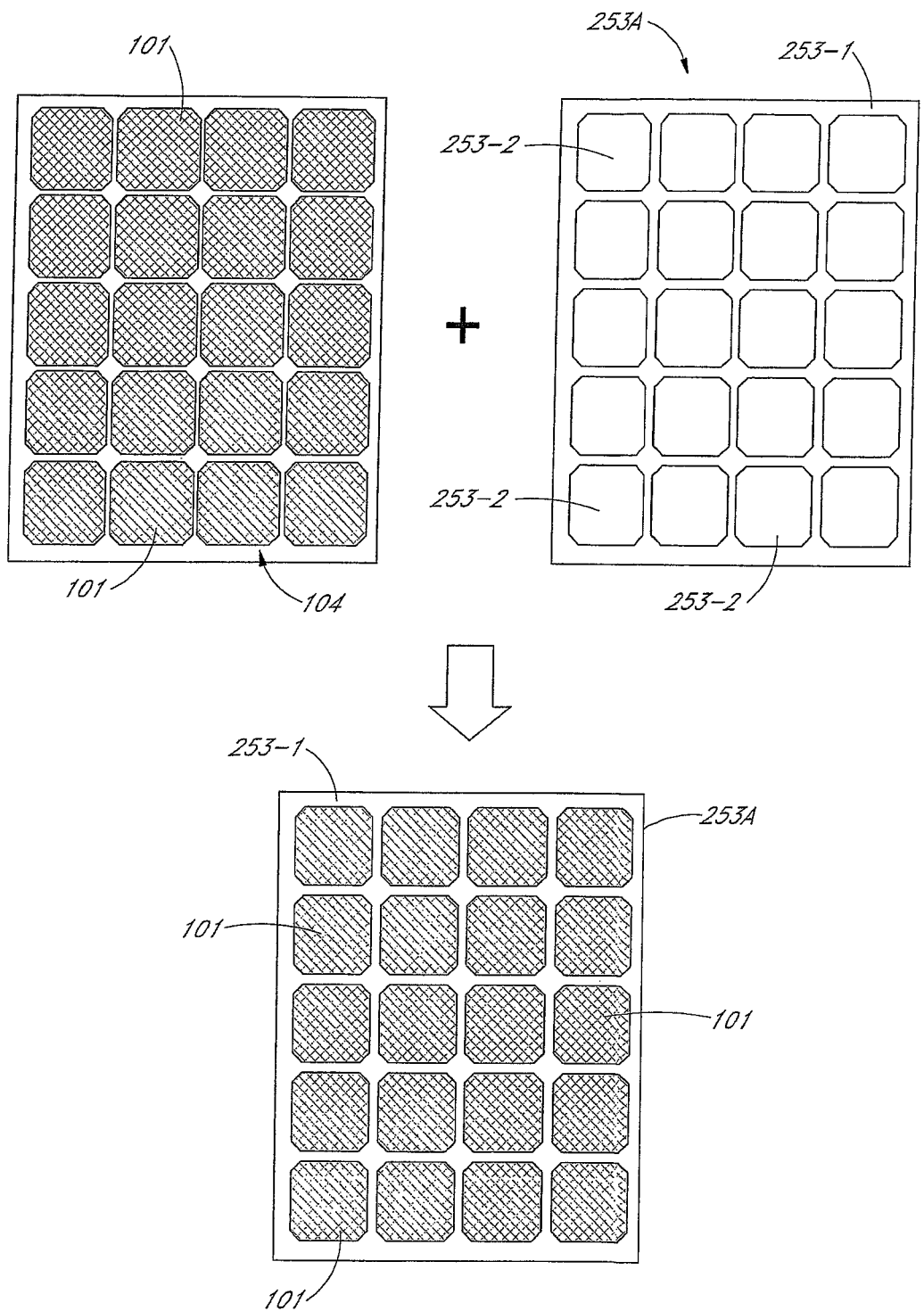
FIG. 11 schematically shows a backsheet that is overlaid on solar cells on a back portion of a bifacial solar cell module in accordance with an embodiment of the present invention.

FIG. 11 schematically illustrates the backsheet 253A of FIG. 10 overlaid on the solar cells 101 on the back portion 104 of the bifacial solar cell module 100 in accordance with an embodiment of the present invention. The example of FIG. 11 shows the bifacial solar cell module 100 as seen from the back portion 104. The backsheet 253A is placed over the solar cells 101 (only some are labeled in FIG. 11) and are formed together by, for example, vacuum lamination. The backsides of the solar cells 101 show through the transparent portions 253-2, while the space between adjacent solar cells 101 and the space between solar cells 101 and the frame are covered by the reflective portion 253-1.

Figure 12:
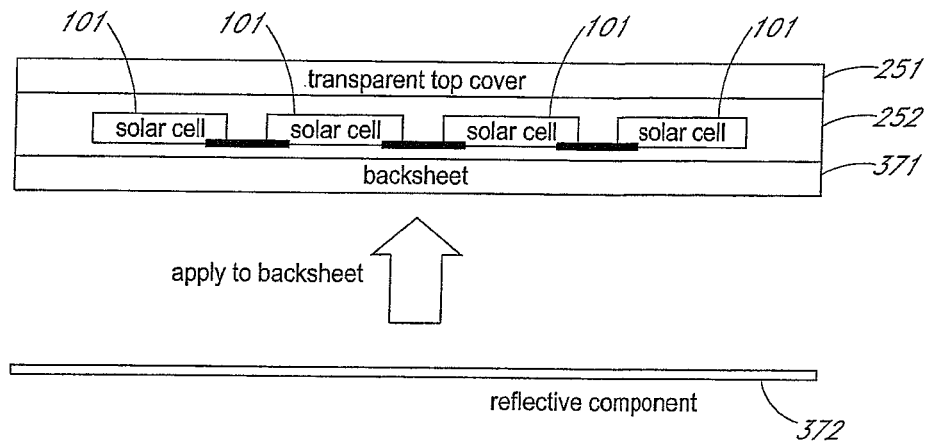
FIG. 12 schematically shows a reflective component that is separate from a backsheet on a back portion of a bifacial solar cell module in accordance with an embodiment of the present invention.

Integrating the reflective portion 253-1 with the backsheet 253 simplifies the manufacture of the bifacial solar cell module 100; the backsheet 253 already comes with the reflective and transparent portions. However, it is not necessary to integrate the reflective portion 253-1 with the backsheet 253. For example, a clear backsheet with no reflective portion may also be used. In that case, after creating the protective package, a separate white (or other colored) tape or other reflective component may be attached on the clear backsheet. An example of this embodiment is schematically illustrated in FIG. 12, where the transparent cover 251, the solar cells 101 encapsulated in the encapsulant 252, and the backsheet 371 are packaged together by, for example, vacuum lamination. The backsheet 371 comprises a completely clear backsheet that exposes the backsides of the solar cells 101 to receive light coming from the back portion of the bifacial solar cell module 100. A reflective component 372 with characteristics and pattern similar to the reflective portion 253-1 may be applied on the backsheet 371 after lamination. For example, the reflective component 372 may comprise white colored tape that is attached to the backsheet 371.

Figure 13:
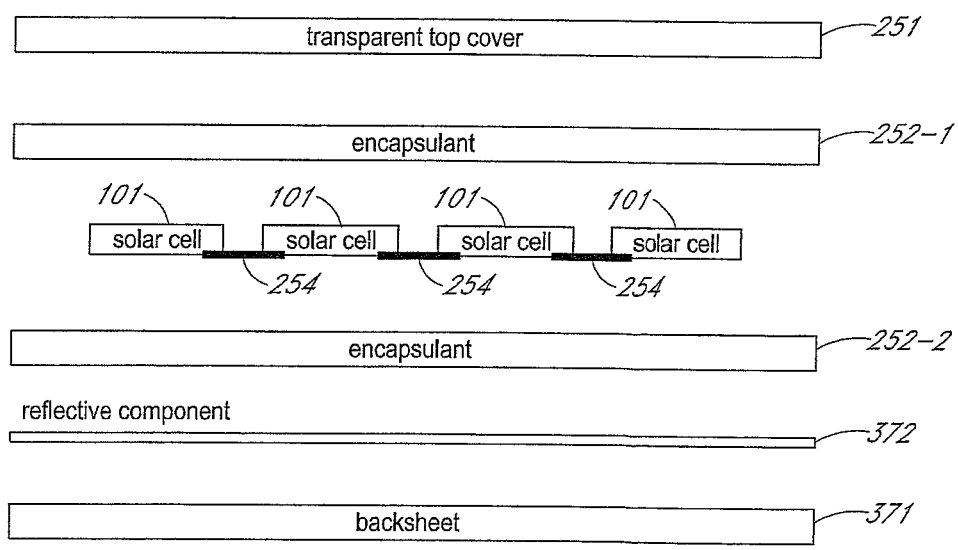
FIG. 13 schematically shows a reflective component that is separate from a backsheet on a back portion of a bifacial solar cell module in accordance with another embodiment of the present invention.

The reflective component 372 may also be placed between the clear backsheet 372 and the encapsulant 252-2 before packaging as shown in FIG. 13. The transparent cover 251, the encapsulants 252-1 and 252-2, the solar cells 101, the reflective material 372, and the backsheet 371 are thereafter formed together to create the protective package, e.g., by vacuum lamination.

Bifacial solar cell modules and methods for manufacturing same have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A bifacial solar cell module comprising:
   a plurality of solar cells;
   an encapsulant that encapsulates the plurality of solar cells;
   a backsheet on a back portion of the bifacial solar cell module; and
   a reflective component having a continuous reflective portion and a plurality of transparent portions that are coplanar with the continuous reflective portion and within spaces defined by the reflective portion.

2. The bifacial solar cell module of claim 1, wherein the reflective component is between the encapsulant and the backsheet.

3. The bifacial solar cell module of claim 1, wherein the backsheet is between the reflective component and the encapsulant.

4. The bifacial solar cell module of claim 1, wherein the backsheet is a clear backsheet.

5. The bifacial solar cell module of claim 1, wherein the solar cells are arranged in an array, and the continuous reflective portion covers rows and columns of the array.

6. The bifacial solar cell module of claim 1, wherein the solar cells are arranged in an array, and the continuous reflective portion covers one dimension of the array.

7. The bifacial solar cell module of claim 1, further comprising:
   a transparent top cover on a front portion of the bifacial solar cell module.

8. The bifacial solar cell module of claim 1, wherein the solar cells comprise backside contact solar cells.

9. A bifacial solar cell module, comprising:
   a plurality of solar cells that are arranged in an array;
   an encapsulant that encapsulates the solar cells;
   a clear backsheet; and
   a reflective component comprising a continuous reflective portion and transparent portions that are coplanar with and within spaces defined by the continuous reflective portion, the continuous reflective portion covering a first dimension of the array.

10. The bifacial solar cell module of claim 9, wherein the first dimension is a row of the array and the continuous reflective portion further covers a column of the array.

11. The bifacial solar cell module of claim 9, wherein the reflective component is between the clear backsheet and the encapsulant.

12. The bifacial solar cell module of claim 9, wherein the clear backsheet is between the encapsulant and the reflective component.

13. The bifacial solar cell module of claim 9, further comprising a transparent top cover on a front portion of the bifacial solar cell module.

14. The bifacial solar cell module of claim 13, further comprising a frame that supports the transparent top cover, the encapsulant, the reflective component, and the clear backsheet.

15. A bifacial solar cell module comprising:
   a transparent top cover on a front portion of the bifacial solar cell module;
   a backsheet on a back portion of the bifacial solar cell module;
   an encapsulant that encapsulates a plurality of solar cells, the encapsulant being disposed between the transparent top cover and the backsheet;
   a reflective component comprising a continuous reflective portion and a plurality of transparent portions, the plurality of transparent portions being coplanar with and within spaces defined by the continuous reflective portion; and
   a frame that mechanically supports the transparent top cover, the backsheet, the encapsulant, and the reflective component.

16. The bifacial solar cell module of claim 15, wherein the backsheet is a clear backsheet and the reflective component is between the encapsulant and the backsheet.

17. The bifacial solar cell module of claim 15, wherein the backsheet is a clear backsheet and the reflective component is on an outside portion of the backsheet.

18. The bifacial solar cell module of claim 15, wherein the solar cells comprise backside contact solar cells.

* * * * *